United States Patent
Zhao et al.

(10) Patent No.: US 11,935,460 B2
(45) Date of Patent: Mar. 19, 2024

(54) SHIFT REGISTER AND DISPLAY PANEL

(71) Applicant: KUNSHAN GO-VISIONOX OPTO-ELECTRONICS CO., LTD, Jiangsu (CN)

(72) Inventors: Xin Zhao, Kunshan (CN); Zhengyong Zhu, Kunshan (CN); Xiyang Jia, Kunshan (CN); Zhili Ma, Kunshan (CN); Huihui Song, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 0 days.

(21) Appl. No.: 18/169,427

(22) Filed: Feb. 15, 2023

(65) Prior Publication Data
US 2023/0196970 A1   Jun. 22, 2023

Related U.S. Application Data

(63) Continuation of application No. PCT/CN2021/113746, filed on Aug. 20, 2021.

(30) Foreign Application Priority Data

Nov. 26, 2020   (CN) .......................... 202011356073.6

(51) Int. Cl.
*G09G 3/20* (2006.01)
*G11C 19/28* (2006.01)

(52) U.S. Cl.
CPC ... *G09G 3/2092* (2013.01); *G09G 2310/0267* (2013.01); *G09G 2310/0286* (2013.01); *G09G 2310/08* (2013.01); *G11C 19/28* (2013.01)

(58) Field of Classification Search
CPC ................ G09G 3/20; G09G 3/2092; G09G 2310/0267; G09G 2310/08; G11C 19/28
See application file for complete search history.

(56) References Cited

U.S. PATENT DOCUMENTS

| | | | |
|---|---|---|---|
| 9,626,933 B2 * | 4/2017 | Zheng | G11C 19/28 |
| 2018/0068635 A1 * | 3/2018 | Zhu | G11C 19/28 |
| 2019/0272884 A1 * | 9/2019 | Liao | G09G 3/20 |

FOREIGN PATENT DOCUMENTS

| | | |
|---|---|---|
| CN | 104537977 A | 4/2015 |
| CN | 105632562 A | 6/2016 |

(Continued)

OTHER PUBLICATIONS

International Search Report dated Nov. 25, 2021, in corresponding International Application No. PCT/CN2021/113746, 4 pages.

(Continued)

*Primary Examiner* — Nelson M Rosario
(74) *Attorney, Agent, or Firm* — Maier & Maier, PLLC (57) ABSTRACT

A shift register and a display panel. The shift register includes an output adjustment module, a trigger write module, and a node adjustment module. A first terminal of the output adjustment module inputs a first clock signal. A second terminal of the output adjustment module inputs a first power signal. The output adjustment module is configured to adjust the shift register to output the first clock signal or the first power signal according to the signal on a first control node and the signal on a second control node of the output adjustment module. The trigger write module is configured to write a trigger signal to the second control node according to the clock signal of the control terminal of the trigger write module. The node adjustment module is configured to adjust the signal on the first control node.

16 Claims, 5 Drawing Sheets

(56) References Cited

FOREIGN PATENT DOCUMENTS

| | | | |
|---|---|---|---|
| CN | 106782337 | A | 5/2017 |
| CN | 109036282 | A | 12/2018 |
| CN | 110739020 | A | 1/2020 |
| CN | 110992871 | A | 4/2020 |
| CN | 111916016 | A | 11/2020 |
| CN | 112489582 | A | 3/2021 |
| JP | 2018046169 | A | 3/2018 |
| KR | 20150019098 | A | 2/2015 |

OTHER PUBLICATIONS

Office Action dated Mar. 24, 2022, in related Chinese Patent Application No. 202011356073.6, 17 pages.
Notice of Rejection dated Dec. 1, 2022, in related Chinese Patent Application No. 202011356073.6, 12 pages.

* cited by examiner

SHIFT REGISTER AND DISPLAY PANEL

CROSS-REFERENCE TO RELATED APPLICATIONS

This application is a continuation of International Patent Application No. PCT/CN2021/113746, filed on Aug. 20, 2021, which claims priority to Chinese Patent Application No. 202011356073.6 filed on Nov. 26, 2020, disclosures of both of which are incorporated herein by reference in their entireties.

TECHNICAL FIELD

The present application relates to the field of shift register technology and, in particular, to a shift register and a display panel.

BACKGROUND

A shift register can shift an input signal and output the input signal. In an electronic circuit, a shift register can provide a required scan signal for a display panel in the display panel and has an important application in the display panel.

However, the existing display panel requires a multi-pulse scan signal, and the existing shift register can output only a single pulse scan signal. As a result, the further application of the shift register is limited.

SUMMARY

The present application provides a shift register and a display panel to enable the shift register to output a multi-pulse scan signal.

In a first aspect, the present application provides a shift register. The shift register includes an output adjustment module, a trigger write module, and a node adjustment module. A first terminal of the output adjustment module inputs a first clock signal. A second terminal of the output adjustment module inputs a first power signal. The output adjustment module is configured to adjust the shift register to output the first clock signal or the first power signal according to the signal on a first control node and the signal on a second control node of the output adjustment module. The trigger write module is configured to write a trigger signal to the second control node according to the clock signal of the control terminal of the trigger write module. The node adjustment module is configured to adjust the signal on the first control node. The node adjustment module includes a power introduction sub-module and a first adjustment sub-module. The power introduction sub-module is configured to introduce a first power signal to the control terminal of the first adjustment sub-module according to a second clock signal of the control terminal of the power introduction sub-module. The first adjustment sub-module is configured to adjust the signal on the first control node according to the signal of the control terminal of the first adjustment sub-module.

In a second aspect, the present application also provides a display panel. The display panel includes at least one gate driving circuit. Each gate driving circuit of at least one gate driving circuit includes multiple cascaded shift registers as described in the first aspect.

In the solutions of the present application, the shift register used includes an output adjustment module, a trigger write module, and a node adjustment module. The first terminal of the output adjustment module inputs the first clock signal. The second terminal of the output adjustment module inputs the first power signal. The output adjustment module is configured to adjust the shift register to output the first clock signal or the first power signal according to the signal on the first control node and the signal on the second control node of the output adjustment module. The trigger write module is configured to write the trigger signal to the second control node according to the clock signal of the control terminal of the trigger write module. The node adjustment module is configured to adjust the signal on the first control node. The node adjustment module includes a power introduction sub-module and a first adjustment sub-module. The power introduction sub-module is configured to introduce the first power signal to the control terminal of the first adjustment sub-module according to the second clock signal of the control terminal of the power introduction sub-module. The first adjustment sub-module is configured to adjust the signal on the first control node according to the signal of the control terminal of the first adjustment sub-module. Through the cooperative control of the trigger write module, the power introduction sub-module, and the first adjustment sub-module, the output signal of the shift register can be a first clock signal at certain moments and a first power signal at certain moments. Further, the shift register can output an output signal including multiple pulses in one frame, that is, the shift register can output a multi-pulse signal.

DETAILED DESCRIPTION

The present application is further described in detail in conjunction with the drawings and embodiments.

It is to be understood that the embodiments set forth below are intended to illustrate and not to limit the present application. Additionally, it is to be noted that for ease of description, only part, not all, of structures related to the present application are illustrated in the drawings.

Figure 1:
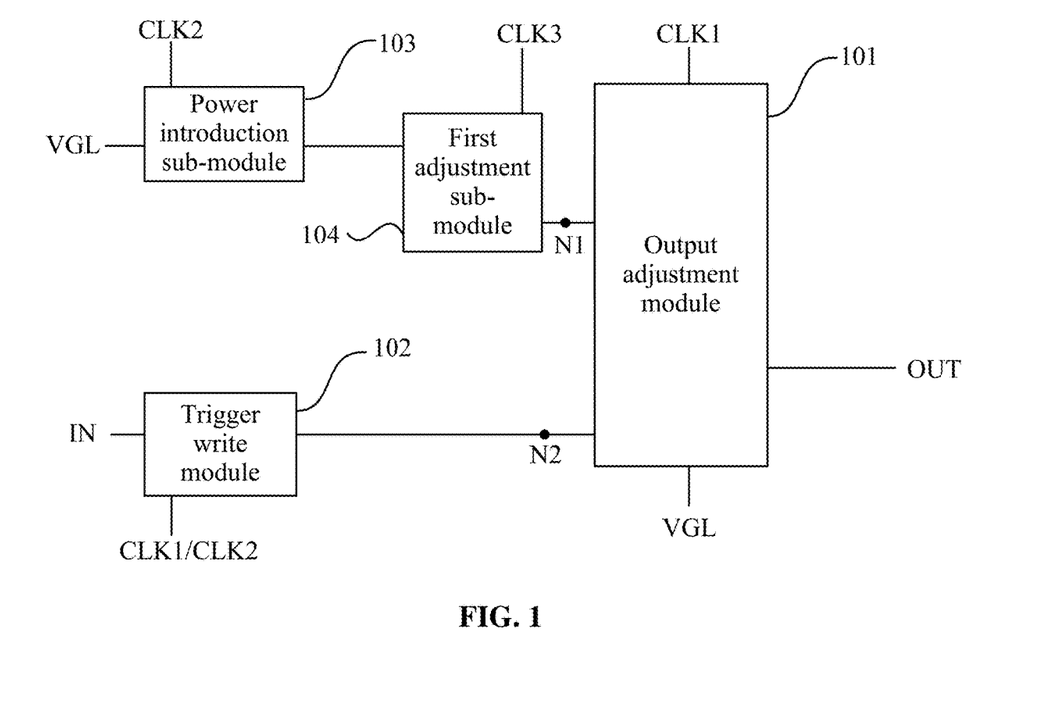
FIG. 1 is a diagram illustrating the circuit structure of a shift register according to the present application.

FIG. 1 is a diagram illustrating the circuit structure of a shift register according to the present application. Referring to FIG. 1, the shift register includes an output adjustment module 101, a trigger write module 102, and a node adjustment module. A first terminal of the output adjustment module 101 inputs a first clock signal CLK1. A second terminal of the output adjustment module 101 inputs a first power signal VGL. The output adjustment module 101 is configured to adjust the output terminal of the output adjustment module 101 of the shift register to output the first clock signal CLK1 or the first power signal VGL according to the signal on a first control node N1 and the signal on a second control node N2 of the output adjustment module 101. The trigger write module 102 is configured to write a trigger signal IN to the second control node N2 according to a first clock signal CLK1 and/or a second clock signal CLK2 of the control terminal of the trigger write module 102. The node adjustment module is configured to adjust the signal on the first control node N1. The node adjustment module includes a power introduction sub-module 103 and a first adjustment sub-module 104. The power introduction sub-module 103 is configured to introduce a first power signal VGL to the control terminal of the first adjustment sub-module 104 according to a second clock signal CLK2 of the control terminal of the power introduction sub-module 103. The first adjustment sub-module 104 is configured to adjust the signal on the first control node N1 according to the signal of the control terminal of the first adjustment sub-module 104. The shift register may control the number of pulses included in a scan signal in one frame by controlling the duty cycle of a first clock signal CLK1 and the effective signal of the trigger signal IN (which may be, for example, a high level in this embodiment).

Specifically, the output adjustment module 101 may control the output signal OUT of the shift register to be the first clock signal CLK1 according to the control signal (which is, for example, effective at a low level) on the first control node N1 and may control the output signal OUT of the shift register to be the first power signal VGL according to the control signal (which is, for example, effective at a low level) on the second control node N2. The first power signal VGL may be at a low level. The power introduction sub-module 103 may be turned on at a low level. A first terminal of the power introduction sub-module 103 accesses the first power signal VGL. The control terminal of the power introduction sub-module 103 accesses the second clock signal CLK2. A second terminal of the power introduction sub-module 103 is electrically connected to the control terminal of the first adjustment sub-module 104. The first adjustment sub-module 104 may be turned on at a low level. When the power introduction sub-module 103 is turned on, the control terminal of the first adjustment sub-module 104 accesses the first power signal VGL, so that the first adjustment sub-module 104 is turned on. A first terminal of the first adjustment sub-module 104 accesses a third clock signal CLK3. A second terminal of the first adjustment sub-module 104 is electrically connected to the first control node N1. When the first adjustment sub-module 104 is turned on, the first adjustment sub-module 104 adjusts the potential on the first control node N1, so that the output signal OUT of the output adjustment module 101 is the first clock signal CLK1. A first terminal of the trigger write module 102 inputs the trigger signal IN.

The control terminal of the trigger write module 102 accesses the first clock signal CLK1 and/or the second clock signal CLK2. The second terminal of the trigger write module 102 is electrically connected to the control node N2. Through the control of the first clock signal CLK1 and/or the second clock signal CLK2, the trigger write module 102 is turned on, and then the potential on the second control node N2 is controlled. In this manner, the output signal OUT of the output adjustment module 101 is the first power signal VGL. That is, through the cooperative control of the trigger write module 102, the power introduction sub-module 103, and the first adjustment sub-module 104, the output signal OUT of the shift register can be the first clock signal CLK1 at certain moments and the first power signal VGL at certain moments. In this manner, the shift register can output an output signal including multiple pulses in one cycle (that is, one frame), that is, the shift register can output a multi-pulse signal.

In this embodiment, the shift register used includes an output adjustment module 101, a trigger write module 102, and a node adjustment module. The first terminal of the output adjustment module 101 inputs the first clock signal CLK1. The second terminal of the output adjustment module 101 inputs the first power signal VGL. The output adjustment module 101 is configured to adjust the output adjustment module 101 of the shift register to output the first clock signal CLK1 or the first power signal VGL according to the signal on the first control node N1 and the signal on the second control node N2 of the output adjustment module 101. The trigger write module 102 is configured to write the trigger signal IN to the second control node N2 according to the clock signal CLK1/CLK2 of the control terminal of the trigger write module 102. The node adjustment module is configured to adjust the signal on the first control node N1. The node adjustment module includes a power introduction sub-module 103 and a first adjustment sub-module 104. The power introduction sub-module 103 is configured to introduce the first power signal VGL to the control terminal of the first adjustment sub-module 104 according to the second clock signal CLK2 accessed by the control terminal of the power introduction sub-module 103. The first adjustment sub-module 104 is configured to adjust the signal on the first control node N1 according to the signal of the control terminal of the first adjustment sub-module 104. Through the cooperative control of the trigger write module 102, the power introduction sub-module 103, and the first adjustment sub-module 104, the output signal OUT of the shift register can be the first clock signal CLK1 at certain moments and the first power signal VGL at certain moments. Further, the shift register can output the output signal including multiple pulses in one frame, that is, the shift register can output a multi-pulse signal.

Figure 2:
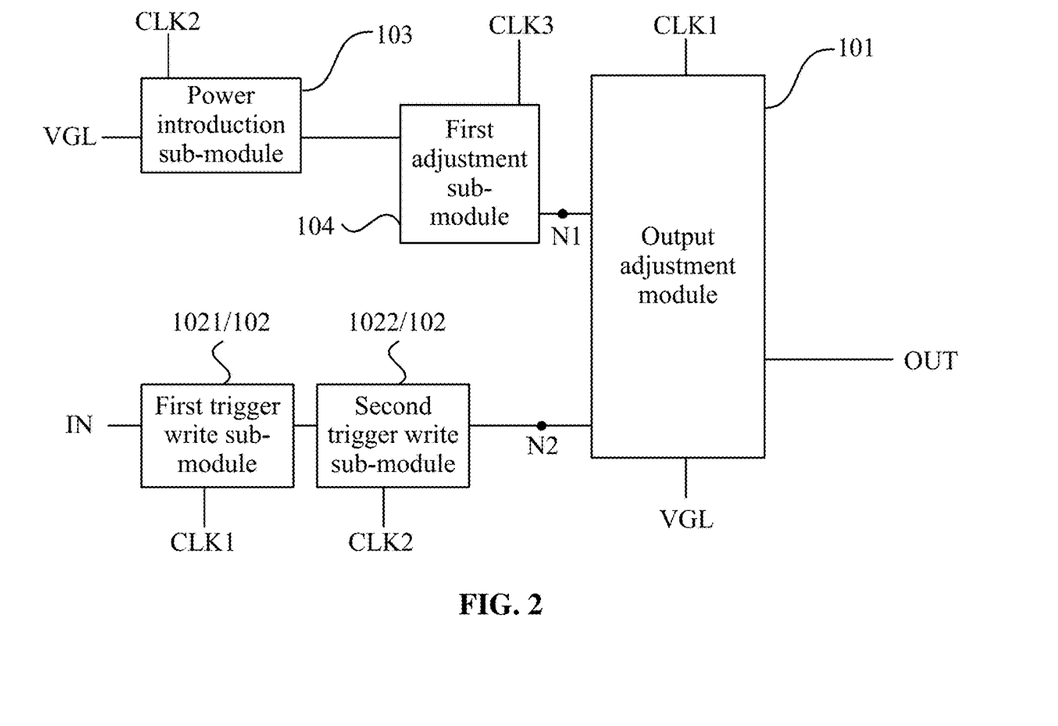
FIG. 2 is a diagram illustrating the circuit structure of another shift register according to the present application.

FIG. 2 is a diagram illustrating the circuit structure of another shift register according to the present application. Referring to FIG. 2, the trigger write module 102 includes a first trigger write sub-module 1021 and a second trigger write sub-module 1022 connected in series. The second trigger write sub-module is disposed between the first trigger write sub-module 1021 and the output adjustment module 101. The control terminal of the first trigger write sub-module 1021 accesses the first clock signal CLK1. The control terminal of the second trigger write sub-module 1022 accesses the second clock signal CLK2.

Specifically, the first trigger write sub-module 1021 can turn on or off a first terminal and a second terminal of the first trigger write sub-module 1021 under the control of the first clock signal CLK1 accessed by the control terminal of the first trigger write sub-module 1021. The second trigger write sub-module 1022 can turn on or off a first terminal and a second terminal of the second trigger write sub-module 1022 under the control of the second clock signal CLK2 accessed by the control terminal of the second trigger write sub-module 1022. The trigger write module 102 may include at least one of a first trigger write sub-module 1021 or a second trigger write sub-module 1022. When the trigger write module 102 includes a first trigger write sub-module 1021 and a second trigger write sub-module 1022, the first trigger write sub-module 1021 and the second trigger write sub-module 1022 may be connected in series or in parallel.

In this embodiment, the first trigger write sub-module 1021 and the second trigger write sub-module 1022 are connected in series. The first terminal of the first trigger write sub-module 1021 inputs the trigger signal IN. The second trigger write sub-module 1022 is connected in series between the first trigger write sub-module 1021 and the output adjustment module 101. The second control node N2 is located between the second trigger write sub-module 1022 and the output adjustment module 101. At this time, since the trigger signal IN can be written to the second control node N2 only when the first trigger write sub-module 1021 and the second trigger write sub-module 1022 are simultaneously turned on, the first clock signal CLK1 and the second clock signal CLK2 may be configured in the following manners: The first clock signal CLK1 includes a first turn-on pulse that enables the first trigger write sub-module 1021 to turn on; the second clock signal CLK2 includes a second turn-on pulse that enables the second trigger write sub-module 1022 to turn on; and the first turn-on pulse at least partially overlaps the second turn-on pulse. The positional relationship between the first trigger write sub-module 1021 and the second trigger write sub-module 1022 is not limited in this embodiment. As shown in FIG. 2, the first terminal of the first trigger write sub-module 1021 is illustratively used as the input terminal of the trigger signal IN. In some other embodiments, the first terminal of the second trigger write sub-module 1022 may also be configured to be used as the input terminal of the trigger signal IN. The trigger write module 102 is configured to include a first trigger write sub-module 1021 and a second trigger write sub-module 1022 connected in series. In this manner, the resistance of the trigger write module 102 can be increased, and the leakage current can be decreased.

Figure 3:
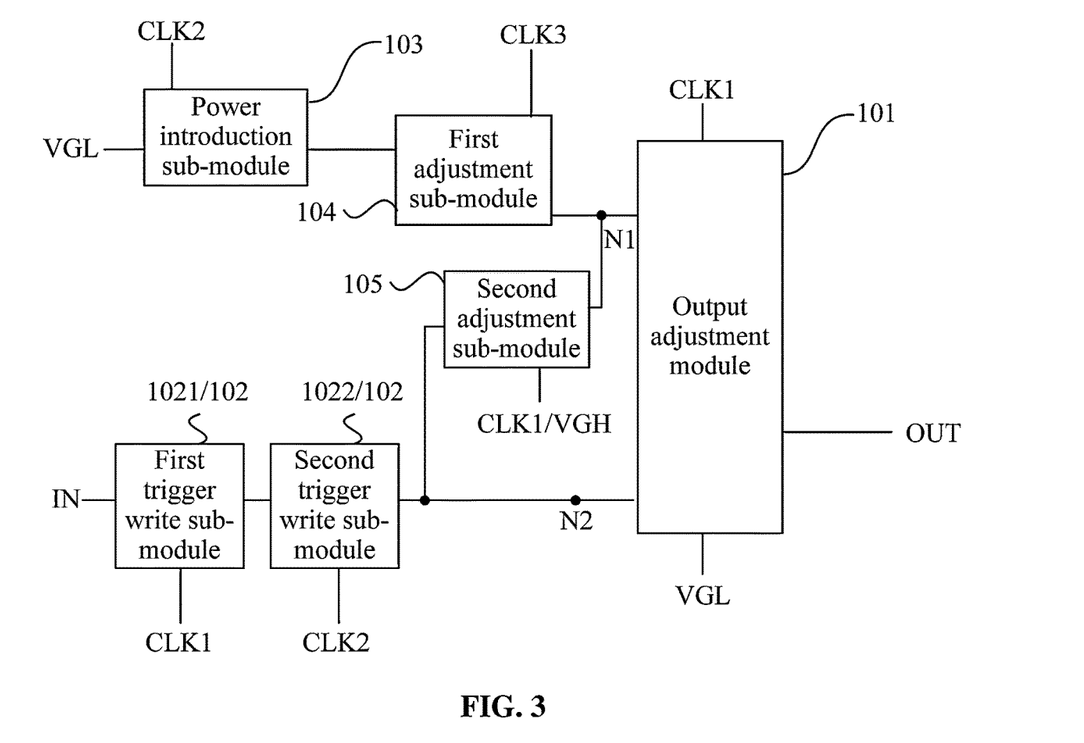
FIG. 3 is a diagram illustrating the circuit structure of another shift register according to the present application.

FIG. 3 is a diagram illustrating the circuit structure of another shift register according to the present application. Referring to FIG. 3, the node adjustment module of the shift register also includes a second retention sub-module 105. The control terminal of the second adjustment sub-module 105 is electrically connected to the second control node N2. A first terminal of the second adjustment sub-module 105 accesses a second power signal VGH or a first clock signal CLK1. A second terminal of the second adjustment sub-module 105 is electrically connected to the first control node N1.

Specifically, the second control node N2 may control the first control node N1 through the second adjustment sub-module 105 in a feedback manner. When the second control node N2 is at a low level, that is, the output adjustment module 101 outputs the first power signal VGL, that is, a low level, the second adjustment sub-module 105 is turned on. The second power signal VGH may be at a high level. If the first terminal of the second adjustment sub-module 105 accesses the second power signal VGH, the first control node N1 is at a high level, thereby further preventing the shift register from outputting the first clock signal CLK1. At this time, the shift register outputs the first power signal VGL, that is, a low level. If the first terminal of the second adjustment sub-module 105 accesses the first clock signal CLK1, and the first clock signal CLK1 is at a low level, the first control node N1 is at a low level. At this time, the first clock signal CLK1 is at a low level. Thus, the output terminal of the shift register also outputs a low level. In this manner, the first power signal VGL at a low level output by the output adjustment module 101 may not be adversely affected when the second control node N2 is at a low level. When the first clock signal CLK1 is at a high level, the first control node N1 is at a high level, that is, the shift register may not output the first clock signal CLK1 at a high level at this time. At this time, the shift register is controlled to output the first power signal VGL at a low level when the second control node N2 is at a low level. In this embodiment, if the first terminal of the second adjustment sub-module 105 inputs the second power signal VGH, the number of turn-on times between the first terminal of the output adjustment module 101 and the output terminal of the output adjustment module 101 can be reduced, and the service time can be extended. If the first terminal of the second adjustment sub-module 105 accesses the first clock signal CLK1, since the potential of the first terminal of the second adjustment sub-module 105 changes frequently, a hysteresis effect caused by a long-time bias can be avoided.

Figure 4:
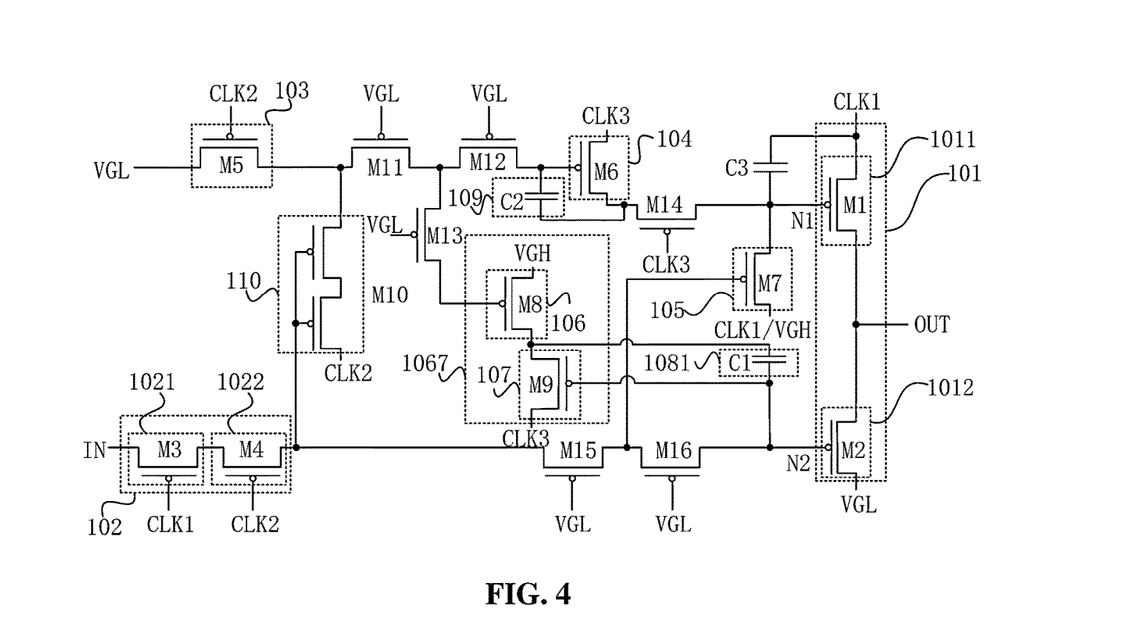
FIG. 4 is a diagram illustrating the circuit structure of another shift register according to the present application.

FIG. 4 is a diagram illustrating the circuit structure of another shift register according to the present application. Referring to FIG. 4, the output adjustment module 101 may include a first output module 1011 and a second output module 1012. The control terminal of the first output module 1011 is electrically connected to the first control node N1. A first terminal of the first output module 1011 accesses the first clock signal CLK1. The control terminal of the second output module 1012 is electrically connected to the second control node N2. A first terminal of the second output module 1012 accesses the first power signal VGL. After a second terminal of the second output module 1012 is short-circuited with a second terminal of the first output module 1011, the node between the second terminal of the second output module 1012 and the second terminal of the first output module 1011 is configured to output the output signal OUT of the shift register.

Specifically, each of the first output module 1011 and the second output module 1012 may be a transistor. For example, the first output module 1011 may be a first transistor M1, and the second output module 1012 may be a second transistor M2. The first transistor M1 and the second transistor M2 may each use a p-type transistor or each use an n-type transistor. This embodiment uses an example in which each of the first output module 1011 and the second output module 1012 is a p-type transistor. When the first control node N1 receives a low level, the first transistor M1 is turned on, so that the shift register outputs the first clock signal CLK1. When the second control node N2 receives a low level, the second transistor M2 is turned on, so that the shift register outputs the first power signal VGL. Each of the first trigger write sub-module 1021 and the second trigger write sub-module 1022 may be a transistor. For example, the first trigger write sub-module 1021 may be a third transistor M3, and the second trigger write sub-module 1022 may be a fourth transistor M4. Each of the two may be a p-type transistor or an n-type transistor. This embodiment uses an example in which each of the third transistor M3 and the fourth transistor M4 is a p-type transistor. The power introduction sub-module 103 may be a fifth transistor M5. The first adjustment sub-module 104 may be a sixth transistor M6. The fifth transistor M5 and the sixth transistor M6 may be each a p-type transistor or an n-type transistor. This embodiment uses an example in which each of the fifth transistor M5 and the sixth transistor M6 is a p-type transistor. The second adjustment sub-module 105 may be a seventh transistor M7. The seventh transistor M7 may be a p-type transistor or an n-type transistor. This embodiment uses an example in which the seventh transistor M7 is a p-type transistor.

Further referring to FIG. 4, the shift register also includes a third adjustment sub-module 1067 and a first storage module 1081. The output terminal of the third adjustment sub-module 1067 is electrically connected to a first terminal of the first storage module 1081. A first input terminal of the third adjustment sub-module 1067 accesses a second power signal VGH. A first control terminal of the third adjustment sub-module 1067 is electrically connected to the control terminal of the first adjustment sub-module 104. A second control terminal of the third adjustment sub-module 1067 is electrically connected to the second control node N2. A second input terminal of the third adjustment sub-module 1067 accesses a third clock signal CLK3. The third adjustment sub-module 1067 is configured to provide the second power signal VGH for the first storage module 1081.

In this embodiment, the second clock signal CLK2 and the third clock signal CLK3 may be signals having opposite timings. The second clock signal CLK2 and the third clock signal CLK3 may also have a certain time margin. The first storage module 1081 may be a first capacitor C1. The third adjustment sub-module 1067 may include a first switch module 106 and a second switch module 107. Each of the first switch module 106 and the second switch module 107 may be a p-type transistor or an n-type transistor. This embodiment uses an example in which the first switch module 106 is an eighth p-type transistor M8, and the second switch module 107 is a ninth p-type transistor M9. A first terminal of the eighth transistor M8 is used as the first input terminal of the third adjustment sub-module 1067. The control terminal of the eighth transistor M8 is used as the first control terminal of the third adjustment sub-module 1067. A second terminal of the eighth transistor M8 is used as the output terminal of the third adjustment sub-module 1067. A second terminal of the ninth transistor M9 is electrically connected to the second terminal of the eighth transistor M8. The control terminal of the ninth transistor M9 is used as the second control terminal of the third adjustment sub-module 1067. A first terminal of the ninth transistor M9 is used as the second input terminal of the third adjustment sub-module 1067. In this embodiment, a second terminal of the first storage module 1081 is electrically connected to the second control terminal of the third adjustment sub-module 1067. When the third clock signal CLK3 hops, a hop signal is not coupled to the output terminal of the shift register, so that the stability of the shift register can be improved.

Figure 5:
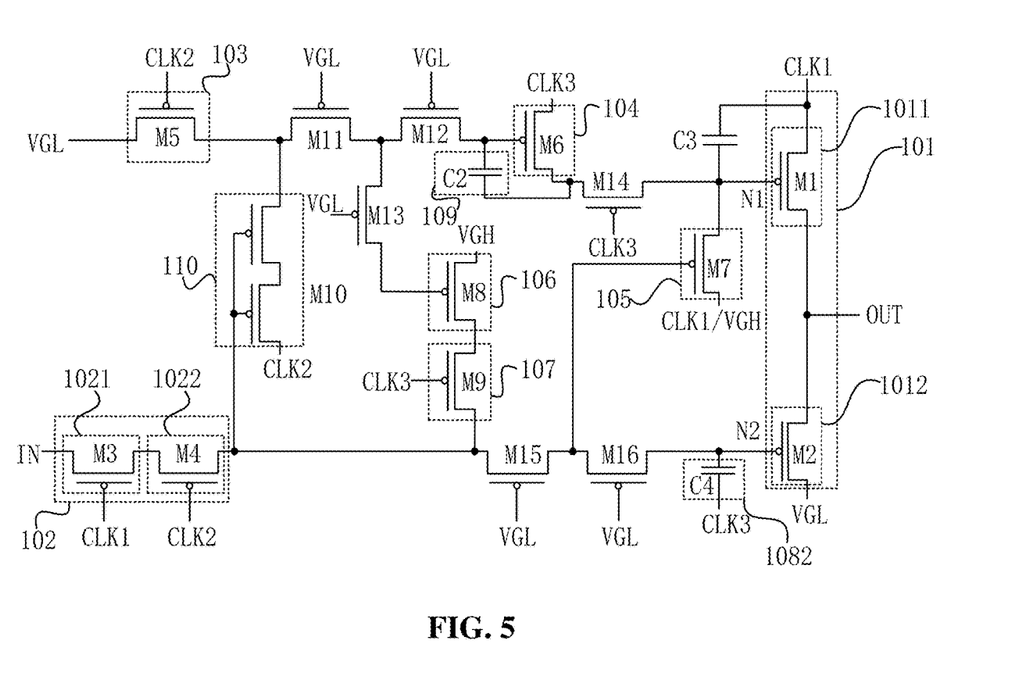
FIG. 5 is a diagram illustrating the circuit structure of another shift register according to the present application.

FIG. 5 is a diagram illustrating the circuit structure of another shift register according to the present application. Unlike the structure shown in FIG. 4, in the shift register shown in FIG. 5, the second terminal of the ninth transistor M9 is electrically connected to the second control node N2. The control terminal of the ninth transistor M9 accesses a third clock signal CLK3. The shift register also includes a first retention module 1082. A first terminal of the first retention module 1082 is electrically connected to the second control node N2. A second terminal of the first retention module 1082 accesses a third clock signal CLK3. In this embodiment, the first retention module 1082 is a fourth capacitor C4. The third clock signal CLK3 is electrically connected to the second control node N2 through the fourth capacitor C4.

Specifically, in this embodiment, the eighth transistor M8 and the ninth transistor M9 may be used as a control path through which the first control node N1 controls the second control node N2 in a feedback manner. When the first control node N1 is at a low level, the eighth transistor M8 is controlled to turn on. At the same time, the third clock signal CLK3 controls the ninth transistor M9 to turn on or off, and through the cooperation of the first retention module 1082, the control terminal of the second transistor M2 is kept at a high level, that is, kept off, to prevent the shift register from outputting the first power signal VGL.

Further referring to FIGS. 4 and 5, the control terminal of the power introduction sub-module 103 accesses the second clock signal CLK2. The first terminal of the power introduction sub-module 103 accesses the first power signal VGL. The second terminal of the power introduction sub-module 103 is electrically connected to the control terminal of the first adjustment sub-module 104. The node adjustment module also includes a second retention sub-module 109. A first terminal of the second retention sub-module 109 is electrically connected to the control terminal of the first adjustment sub-module 104. A second terminal of the second retention sub-module 109 is electrically connected to the first control node N1.

Specifically, the second retention sub-module 109 may be a second capacitor C2. The second capacitor C2 can keep the potential of the control terminal of the first adjustment sub-module 104 so that the first adjustment sub-module 104 is kept on or off. In this manner, the stability of the output signal of the shift register can be improved.

Further referring to FIGS. 4 and 5, the shift register also includes a clock write module 110. The control terminal of the clock write module 110 is electrically connected to the second control node N2. A first terminal of the clock write module 110 accesses a second clock signal CLK2. A second terminal of the clock write module 110 is electrically connected to the control terminal of the first adjustment sub-module 104.

The clock write module 110 may be configured to be turned on when the second clock signal CLK2 is at a high level, and the trigger signal IN is at a low level; and input a high-level signal to the control terminal of the first adjustment sub-module 104. In this manner, the first adjustment sub-module 104 is prevented from being wrongly turned on, thereby preventing the first output module 1011 from being wrongly turned on. Thus, the working stability of the shift register is further improved. The clock write module 110 may be a tenth transistor M10. The tenth transistor M10 may be a p-type transistor or an n-type transistor. This embodiment uses an example in which the tenth transistor M10 is a p-type transistor having a double-gate structure.

The shift register also includes a third capacitor C3. A first terminal of the third capacitor C3 accesses the first clock signal CLK1. A second terminal of the third capacitor C3 is electrically connected to the first control node N1. The third capacitor C3 is configured to keep the potential on the first control node N1 so that when the first adjustment sub-module 104 is turned off, the control terminal of the first output module 1011 can be kept at a low level, thereby ensuring that the shift register normally outputs the first clock signal CLK1.

Further referring to FIGS. 4 and 5, the shift register may also include at least one of an eleventh transistor M11, a twelfth transistor M12, a thirteenth transistor M13, a fifteenth transistor M15, or a sixteenth transistor M16. The eleventh transistor M11, the twelfth transistor M12, the thirteenth transistor M13, the fifteenth transistor M15, and the sixteenth transistor M16 are each a normally-on transistor and configured to block a current to reduce the leakage current of the shift register, thereby further improving the stability.

The shift register may also include a fourteenth transistor M14. The fourteenth transistor M14 is connected between the first control node N1 and the second terminal of the first adjustment sub-module 104. The fourteenth transistor M14 may isolate the second capacitor C2 from the first transistor M1 to avoid the influence of the signal on the second capacitor C2 on the signal on the control terminal of the first transistor M1 when the third clock signal CLK3 is at a high level. Thus, the working stability of the shift register is further improved.

Figure 6:
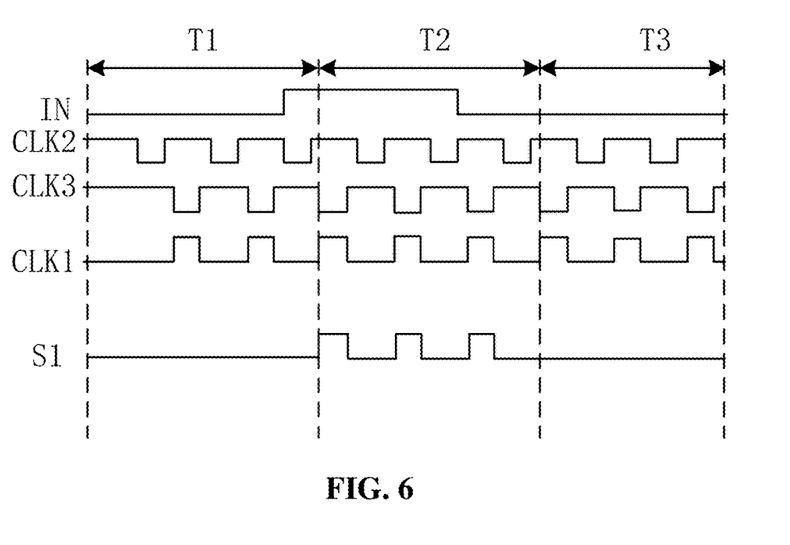
FIG. 6 is a timing diagram of a shift register according to the present application.

FIG. 6 is a timing diagram of a shift register according to the present application. The timing diagram shown in FIG. 6 may correspond to the shift register shown in FIG. 4 or FIG. 5. As shown in FIG. 6, the specific working process of the shift register is below.

In a first time period T1, the trigger signal IN is at a low level. When the first clock signal CLK1 and the second clock signal CLK2 are at low potentials, the trigger write module 102 is turned on. The trigger signal IN is written to the second control node N2. When the third clock signal CLK3 hops to a low potential, the second transistor M2 is turned on, and the shift register outputs the first power signal VGL. When the trigger signal IN is at a high level, the high level is written to the control terminal of the second transistor M2, and the shift register has no output. At this time, the output terminal of the shift register is kept at a low level by the load capacitance of the display region of the display panel. Moreover, at this time, the tenth transistor M10 is turned off, and the control terminal of the sixth transistor M6 stores a low potential.

In a second time period T2, the trigger signal IN is at a high level. The third clock signal CLK3 is from a high potential to a low potential. The low potential of the third clock signal CLK3 is written to the control terminal of the first transistor M1. The output signal OUT is the first clock signal CLK1. The first clock signal CLK1 is from a high potential to a low potential or from a low potential to a high potential, and the output signal OUT is output following the first clock signal CLK1.

In a third time period T3, the trigger signal IN is at a low level and is written to the control terminal of the second transistor M2 in advance. The third clock signal CLK3 is from a high level to a low level, so that the second transistor M2 outputs a low level.

Thus, a multi-pulse scan signal S1 is output in one frame. The scan signal S1 can be shifted by cascaded shift registers.

Figure 7:
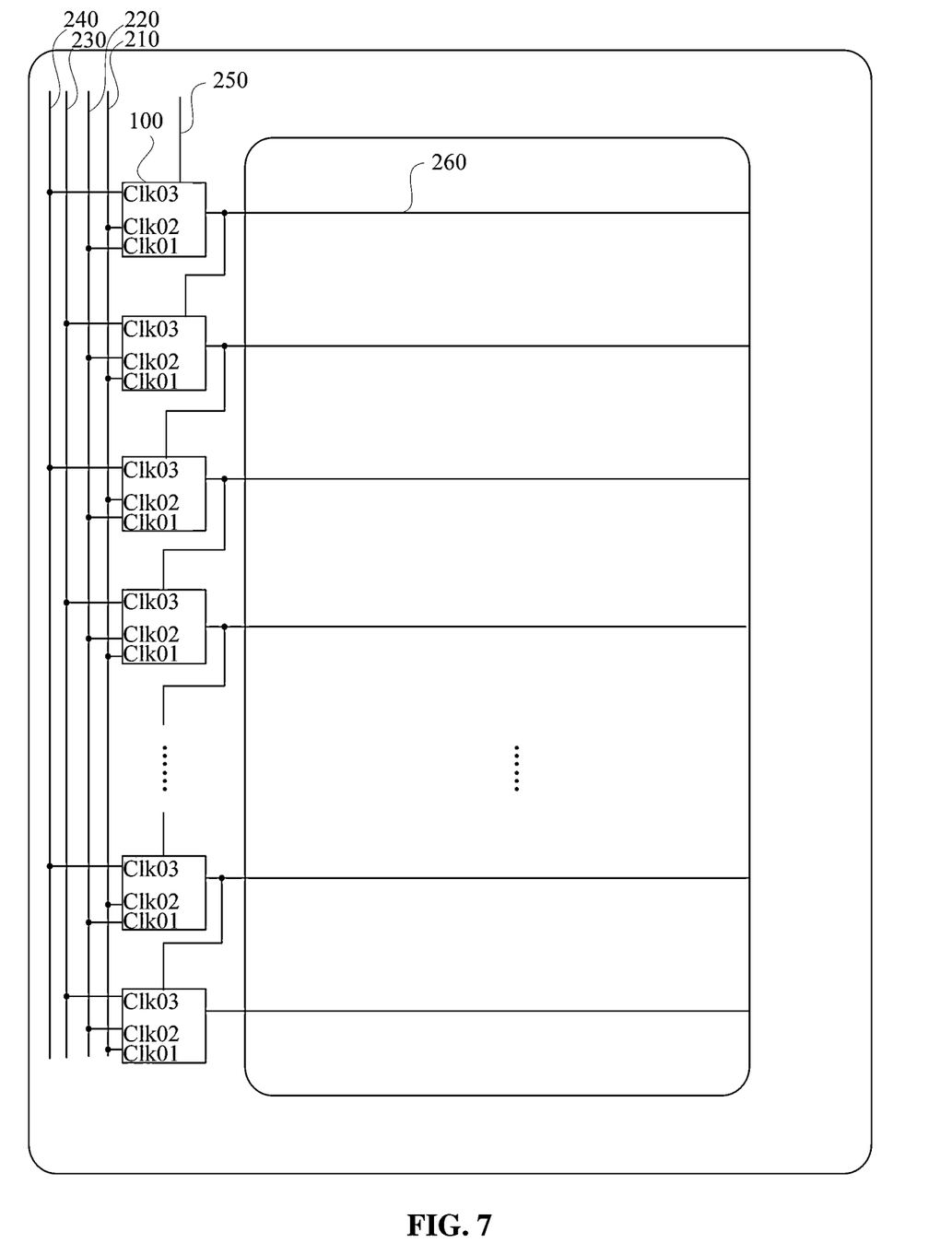
FIG. 7 is a diagram illustrating the structure of a display panel according to the present application.

The present application also provides a display panel. As shown in FIG. 7, the display panel 100 includes at least one gate driving circuit located in a non-display region. FIG. 7 illustrates a gate driving circuit. Each gate driving circuit includes multiple cascaded shift registers 100 as provided in any embodiment of the present application. Thus, the display panel provided by the present application has the preceding beneficial effects, and the details are not repeated here.

Figure 8:
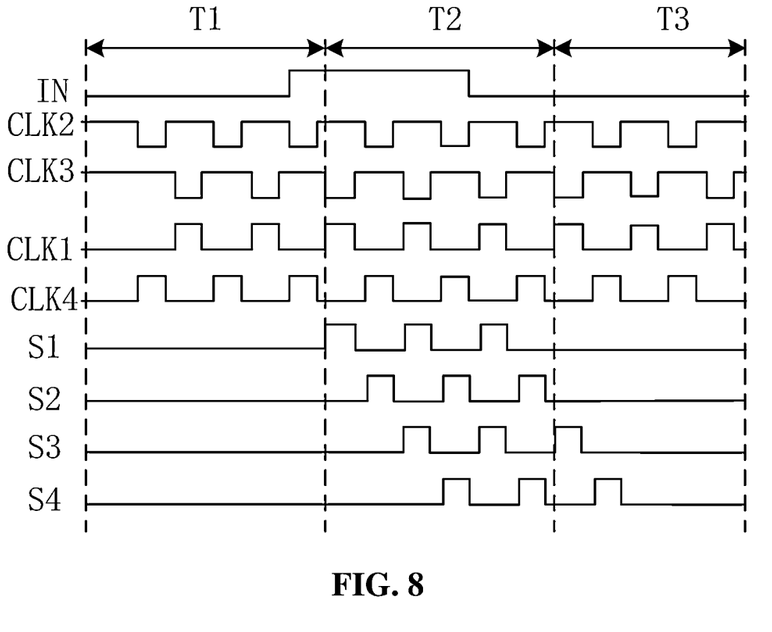
FIG. 8 is timing diagram of the display panel shown in FIG. 7.

The output terminal of each shift register 100 is electrically connected to a corresponding scan signal line 260 in the display panel. The output signal of each shift register 100 is transmitted to the corresponding scan signal line 260 in the display panel. The pixel unit located in the display region emits light under the control of the scan signal transmitted by the corresponding scan signal line 260 and the data signal transmitted by a corresponding data signal line. In conjunction with FIGS. 7 and 8, the display panel may also include multiple clock signal lines, such as a first clock signal line 210, a second clock signal line 220, a third clock signal line 230, and a fourth clock signal line 240. The display panel may also include a trigger input signal line 250. The trigger input signal line 250 is configured to input the trigger signal IN. The first clock signal line 210 is configured to input a first clock signal CLK1. The second clock signal line 220 is configured to input a second clock signal CLK2. The third clock signal line 230 is configured to input a third clock signal CLK3. The fourth clock signal line 240 is configured to input a fourth clock signal CLK4. As shown in FIG. 8, the first clock signal CLK1 and the second clock signal CLK2 may be reversed clock signals. The third clock signal CLK3 and the fourth clock signal CLK4 may be opposite clock signals. A shift register 100 includes a first clock signal input terminal Clk01, a second clock signal input terminal Clk02, and a third clock signal input terminal Clk03. The first clock signal input terminal Clk01, the second clock signal input terminal Clk02, and the third clock signal input terminal Clk03 are configured to respectively input a first clock signal CLK1, a second clock signal CLK2, and a third clock signal CLK3 respectively. In this embodiment, a first clock signal input terminal Clk01 of an even-numbered stage shift register may be configured to be electrically connected to the first clock signal line 210. A second clock signal input terminal Clk02 of the even-numbered stage shift register may be configured to be electrically connected to the second clock signal line 220. A third clock signal input terminal Clk03 of the even-numbered stage shift register may be configured to be electrically connected to the third clock signal line 230. A first clock signal input terminal Clk01 of an odd-numbered stage shift register may be configured to be electrically connected to the second clock signal line 220. A second clock signal input terminal Clk02 of the odd-numbered stage shift register may be configured to be electrically connected to the first clock signal line 210. A third clock signal input terminal Clk03 of the odd-numbered stage shift register may be configured to be electrically connected to the fourth clock signal line 240. In this manner, the step-by-step shift output of the output signal (the output signal S1 of the first-stage shift register, the output signal S2 of the second-stage shift register, the output signal S3 of the third-stage shift register, and the output signal S4 of the fourth-stage shift register) of the shift register is implemented.

It is to be noted that the above are only preferred embodiments of the present application and the principles used therein. It will be understood by those skilled in the art that the present application is not limited to the specific embodiments described herein. Those skilled in the art can make various apparent variations, adaptions, and substitutions without departing from the scope of the present application. The scope of the present application is determined by the scope of the appended claims.

What is claimed is:
1. A shift register, comprising:
an output adjustment module, wherein a first terminal of the output adjustment module is configured to input a first clock signal, a second terminal of the output adjustment module is configured to input a first power signal, and the output adjustment module is configured to adjust the shift register to output the first clock signal or the first power signal according to a signal on a first control node and a signal on a second control node of the output adjustment module;
a trigger write module configured to write a trigger signal accessed by a first terminal of the trigger write module to the second control node according to at least one of the first clock signal or a second clock signal of a control terminal of the trigger write module; and
a node adjustment module configured to adjust the signal on the first control node, wherein the node adjustment module comprises:

a first adjustment sub-module configured to adjust the signal on the first control node according to a signal of a control terminal of the first adjustment sub-module; and a power introduction sub-module configured to introduce the first power signal to a control terminal of the first adjustment sub-module according to the second clock signal of a control terminal of the power introduction sub-module, a first terminal of the power introduction sub-module is configured to access the first power signal, and a second terminal of the power introduction sub-module is electrically connected to the control terminal of the first adjustment sub-module.

2. The shift register according to claim 1, wherein the trigger write module comprises a first trigger write sub-module and a second trigger write sub-module which are connected in series, the second trigger write sub-module is connected between the first trigger write sub-module and the output adjustment module, a control terminal of the first trigger write sub-module accesses the first clock signal, a control terminal of the second trigger write sub-module accesses the second clock signal.

3. The shift register according to claim 2, wherein the first clock signal comprises a first turn-on pulse that enables the first trigger write sub-module to turn on, the second clock signal comprises a second turn-on pulse that enables the second trigger write sub-module to turn on, and the first turn-on pulse at least partially overlaps the second turn-on pulse.

4. The shift register according to claim 1, further comprising:
a second adjustment sub-module, wherein a control terminal of the second adjustment sub-module is electrically connected to the second control node, a first terminal of the second adjustment sub-module accesses a second power signal or the first clock signal, and a second terminal of the second adjustment sub-module is electrically connected to the first control node.

5. The shift register according to claim 1, wherein a first terminal of the first adjustment sub-module accesses a third clock signal, and a second terminal of the first adjustment sub-module is electrically connected to the first control node; and the shift register further comprises a third adjustment sub-module and a first storage module, wherein a first input terminal of the third adjustment sub-module accesses a second power signal, a first control terminal of the third adjustment sub-module is electrically connected to the control terminal of the first adjustment sub-module, a second control terminal of the third adjustment sub-module is electrically connected to the second control node, an output terminal of the third adjustment sub-module is electrically connected to a first terminal of the first storage module, a second input terminal of the third adjustment sub-module inputs a third clock signal, and the third adjustment sub-module is configured to provide the second power signal for the first storage module.

6. The shift register according to claim 5, wherein the first storage module comprises a first capacitor.

7. The shift register according to claim 1, further comprising:
a first retention module, wherein a first terminal of the first retention module is electrically connected to the second control node, and a second terminal of the first retention module accesses a third clock signal.

8. The shift register according to claim 7, wherein the first retention module comprises a fourth capacitor.

9. The shift register according to claim 1, wherein the output adjustment module comprises:
a first output module, wherein a control terminal of the first output module is electrically connected to the first control node, and a first terminal of the first output module accesses the first clock signal; and
a second output module, wherein a control terminal of the second output module is electrically connected to the second control node, a first terminal of the second output module accesses the first power signal, and a second terminal of the second output module is short-circuited with a second terminal of the first output module to output an output signal of the shift register.

10. The shift register according to claim 1, wherein the control terminal of the power introduction sub-module accesses the second clock signal, the node adjustment module further comprises a second retention sub-module, a first terminal of the second retention sub-module is electrically connected to the control terminal of the first adjustment sub-module, and a second terminal of the second retention sub-module is electrically connected to the first control node.

11. The shift register according to claim 10, wherein the second retention sub-module comprises a second capacitor.

12. The shift register according to claim 1, further comprising:
a clock write module, wherein a control terminal of the clock write module is electrically connected to the second control node, a first terminal of the clock write module accesses a second clock signal, and a second terminal of the clock write module is electrically connected to the control terminal of the first adjustment sub-module.

13. The shift register according to claim 2, wherein the first trigger write sub-module comprises a third transistor, and the second trigger write sub-module comprises a fourth transistor, wherein a control terminal of the third transistor accesses the first clock signal, a first terminal of the third transistor is used as an input terminal of the trigger write module, a second terminal of the third transistor is connected to a first terminal of the fourth transistor, a control terminal of the fourth transistor accesses the second clock signal, and a second terminal of the fourth transistor is used as an output terminal of the trigger write module.

14. The shift register according to claim 9, wherein the first output module comprises a first transistor, and the second output module comprises a second transistor, wherein a control terminal of the first transistor is electrically connected to the first control node, and a first terminal of the first transistor accesses the first clock signal; and a control terminal of the second transistor is electrically connected to the second control node, a first terminal of the second transistor accesses the first power signal, and a second terminal of the second transistor is short-circuited with a second terminal of the first transistor to output the output signal of the shift register.

15. The shift register according to claim 1, wherein the shift register further comprises a third capacitor, a first terminal of the third capacitor accesses the first clock signal, and a second terminal of the third capacitor is electrically connected to the first control node.

16. A display panel, comprising at least one gate driving circuit, wherein each gate driving circuit of the at least one gate driving circuit comprises a plurality of cascaded shift registers according to claim 1.

* * * * *